(12) United States Patent
Chu et al.

(10) Patent No.: US 10,818,497 B2
(45) Date of Patent: Oct. 27, 2020

(54) PATTERNED STRUCTURE FOR ELECTRONIC DEVICE AND MANUFACTURING METHOD THEREOF

(71) Applicant: Winbond Electronics Corp., Taichung (TW)

(72) Inventors: Yen-Jui Chu, Taichung (TW); Hsin-Hung Chou, Taichung (TW); Ming-Chih Tsai, Taichung (TW)

(73) Assignee: Winbond Electronics Corp., Taichung (TW)

( * ) Notice: Subject to any disclaimer, the term of this patent is extended or adjusted under 35 U.S.C. 154(b) by 106 days.

(21) Appl. No.: 15/681,436

(22) Filed: Aug. 21, 2017

(65) Prior Publication Data

US 2018/0151374 A1 May 31, 2018

(30) Foreign Application Priority Data

Nov. 29, 2016 (CN) .......................... 2016 1 1069060

(51) Int. Cl.
*H01L 21/28* (2006.01)
*H01L 23/00* (2006.01)
(Continued)

(52) U.S. Cl.
CPC .... *H01L 21/28123* (2013.01); *B81C 1/00373* (2013.01); *H01L 21/3213* (2013.01);
(Continued)

(58) Field of Classification Search
CPC .............. H01L 21/28123; H01L 24/00; H01L 29/4908; H01L 21/3213; H01L 21/28;
(Continued)

(56) References Cited

U.S. PATENT DOCUMENTS 6,989,297 B2 * 1/2006 Sebesta ................. H01L 23/498
257/775
2001/0054771 A1 * 12/2001 Wark .................. G01R 1/06738
257/786
(Continued)

FOREIGN PATENT DOCUMENTS

CN 103606585 2/2014
CN 106104430 11/2016
(Continued)

OTHER PUBLICATIONS

"Office Action of China Counterpart Application," dated Sep. 25, 2019, p. 1-p. 8.

*Primary Examiner* — Stephen W Smoot
*Assistant Examiner* — Vicki B. Booker
(74) *Attorney, Agent, or Firm* — JCIPRNET

(57) ABSTRACT

The present invention provides a patterned structure for an electronic device and a manufacturing method thereof. The patterned structure includes a patterned layer, a blocking structure, a cantilever structure, and a connection structure. The patterned layer is disposed on a substrate. The blocking structure is disposed on the substrate at one side of the patterned layer, wherein a thickness of the blocking structure is smaller than a thickness of the patterned layer. The cantilever structure is disposed on the substrate and located between the patterned layer and the blocking structure. The cantilever structure is connected with the patterned layer and the blocking structure. The connection structure is connected between the patterned layer and the substrate at one side of the patterned layer, and located on the cantilever structure and the blocking structure.

11 Claims, 3 Drawing Sheets

(51) Int. Cl.
*H01L 25/065* (2006.01)
*B81C 1/00* (2006.01)
*H01L 21/3213* (2006.01)
*H01L 29/49* (2006.01)

(52) U.S. Cl.
CPC .............. *H01L 24/00* (2013.01); *H01L 24/24* (2013.01); *H01L 24/82* (2013.01); *H01L 25/0657* (2013.01); *H01L 29/4908* (2013.01); *H01L 2224/24145* (2013.01); *H01L 2224/24998* (2013.01); *H01L 2224/82102* (2013.01)

(58) Field of Classification Search
CPC ......... H01L 21/28008; H01L 21/28017; H01L 21/28026; H01L 21/28079; H01L 21/28088; H01L 21/28097; H01L 21/28114; H01L 21/283; H01L 21/288; H01L 24/80; H01L 24/83; H01L 24/84; H01L 24/89; H01L 24/91; H01L 24/92; H01L 29/40; H01L 29/401; H01L 29/41; H01L 29/43; H01L 29/49; H01L 29/495; H01L 29/4958; H01L 29/4966; H01L 29/4975; H01L 29/51; H01L 21/321; H01L 24/27; H01L 24/29; H01L 24/32; H01L 21/4867; H01L 24/24; H01L 23/528; H01L 21/76838; H01L 2224/29026; H01L 2224/32227; H01L 2224/48091; H01L 2224/73265; H01L 2224/24145; H01L 24/82; H01L 25/0657; H01L 2224/82102; H01L 2224/24998; B81C 1/00373; B81C 1/00349; H01P 5/085; B33Y 80/00; Y10T 29/49117
See application file for complete search history.

(56) References Cited

U.S. PATENT DOCUMENTS

| | | | | |
|---|---|---|---|---|
| 2003/0149505 | A1* | 8/2003 | Mogensen | H05K 3/125 700/117 |
| 2007/0001296 | A1* | 1/2007 | Lee | H01L 23/562 257/723 |
| 2009/0079097 | A1* | 3/2009 | Williams | H01L 24/85 257/787 |
| 2010/0300522 | A1* | 12/2010 | Ginley | H01L 31/022425 136/256 |
| 2013/0295720 | A1* | 11/2013 | Fuergut | H01L 23/3107 438/107 |
| 2014/0061705 | A1 | 3/2014 | Tischler | |
| 2016/0020501 | A1 | 1/2016 | Lindsey | |
| 2016/0093525 | A1* | 3/2016 | Cook | H01L 21/4867 257/676 |

FOREIGN PATENT DOCUMENTS

| | | |
|---|---|---|
| TW | 200603691 | 1/2006 |
| TW | 201030935 | 8/2010 |
| TW | 201039304 | 11/2010 |
| TW | 201103146 | 1/2011 |
| TW | I432265 | 4/2014 |
| TW | I514543 | 12/2015 |

* cited by examiner

PATTERNED STRUCTURE FOR ELECTRONIC DEVICE AND MANUFACTURING METHOD THEREOF

CROSS-REFERENCE TO RELATED APPLICATION

This application claims the priority benefit of China application serial no. 201611069060.4, filed on Nov. 29, 2016. The entirety of the above-mentioned patent application is hereby incorporated by reference herein and made a part of this specification.

BACKGROUND OF THE INVENTION

Field of the Invention

The invention relates to a patterned structure, and particularly relates to a patterned structure having a large step height.

Description of Related Art

Applying a printing process to form an electronic device possesses various advantages, including simple and rapid. Specifically, complicated steps for performing a lithography process can be avoided by printing an ink to form any pattern by simple steps of alignment, printing and curing. Additionally, in the printing process, fewer apparatuses are required, a material utilization rate is high and a process cycle is short. Thus, a manufacturing cost of the electronic device can be reduced.

Particularly, the printing process includes an inkjet printing. In the inkjet printing, if a step height is excessively large (e.g., larger than 200 nm), it may cause a problem of discontinuity of a subsequently formed layer at sidewalls of the step.

SUMMARY OF THE INVENTION

The invention provides a patterned structure having a better step coverage.

The invention provides a manufacturing method of a patterned structure, which can prevent the problem of discontinuity of the layer on the sidewalls of the step.

According to an embodiment of the invention, the patterned structure is used for an electronic device. The patterned structure includes a patterned layer, a blocking structure, a cantilever structure and a connection structure. The patterned layer is disposed on a substrate. The blocking structure is disposed on the substrate at one side of the patterned layer, wherein a thickness of the blocking structure is smaller than a thickness of the patterned layer. The cantilever structure is disposed on the substrate and located between the patterned layer and the blocking structure. The cantilever structure is connected with the patterned layer and the blocking structure. The connection structure is connected between the patterned layer and the substrate at one side of the patterned layer, and located on the cantilever structure and the blocking structure.

According to an embodiment of the invention, the patterned structure is used for an electronic device. The patterned structure includes a patterned layer, a blocking structure, a cantilever structure and a connection structure. The patterned layer is disposed on a substrate. The blocking structure is disposed on the substrate at one side of the patterned layer, wherein a thickness of the blocking structure is smaller than a thickness of the patterned layer. The cantilever structure is disposed on the substrate and located between the patterned layer and the blocking structure. The cantilever structure is connected with the patterned layer and the blocking structure. The connection structure is disposed on the patterned layer, the cantilever structure, and the blocking structure, wherein a material of the blocking structure and a material of the connection structure both include a conductive material.

The invention provides a manufacturing method of a patterned structure for an electronic device. The manufacturing method of the patterned structure includes the following steps. A patterned layer is formed on a substrate. A blocking structure is formed on the substrate at one side of the patterned layer, wherein a thickness of the blocking structure is smaller than a thickness of the patterned layer. A cantilever structure is formed on the substrate and located between the patterned layer and the blocking structure. The cantilever structure is connected with the patterned layer and the blocking structure. A connection structure is formed to be connected between the patterned layer and the substrate at one side of the patterned layer, and is formed on the cantilever structure and the blocking structure.

Based on the above, by providing the blocking structure and the cantilever structure at one side of the patterned layer, a slope between the patterned layer and the substrate at one side of the patterned layer can be reduced, or a step height of one side of the patterned layer can be reduced. Therefore, when forming the connection structure connected between the patterned layer and the substrate at one side of the patterned layer, the phenomenon of discontinuity of the connection structure on the sidewalls of the patterned layer can be prevented, thereby increasing the step coverage of the connection structure. Additionally, the size of the cantilever structure can be easily adjusted by adjusting the thickness of the blocking structure, the thickness of the cantilever structure, and the interval between the blocking structure and the patterned layer. In other words, the aforementioned slope or the step height can be easily adjusted.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
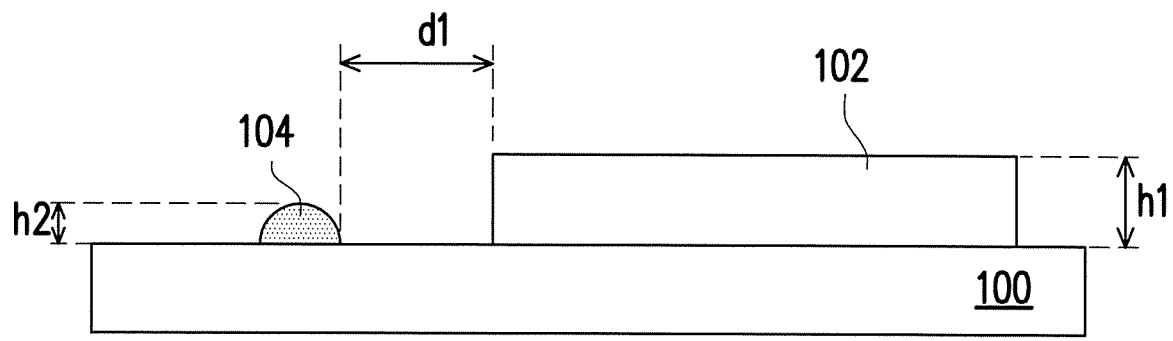
FIG. 1A to FIG. 1C are schematic cross-sectional views of a manufacturing process of a patterned structure according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring to FIG. 1A, the manufacturing method of the patterned structure for an electronic device of the embodiment includes the following steps. First, a patterned layer 102 is formed on a substrate 100. In an embodiment, the substrate 100 may include a semiconductor substrate, a glass substrate or a flexible substrate. The patterned layer 102 may be a thin film composed of any material, and the patterned layer 102 may also be a semiconductor device or a die. The invention is not limited to the types of the substrate 100 and the patterned layer 102. A thickness h1 of the patterned layer 102 may be larger than 200 nm. If a layer is directly formed on the patterned layer 102 by an inkjet printing method, a step height between the patterned layer 102 and the substrate 100 at one side of the patterned layer 102 may be excessively large that cause the problem of discontinuity of the layer on the sidewall of the patterned layer 102. For example, the aforementioned layer may be a connection structure connected between the patterned layer 102 and the substrate 100 at one side of the patterned layer 102.

Then, a blocking structure 104 is formed on the substrate 100 at one side of the patterned layer 102. In the embodiment, a material of the blocking structure 104 may be an insulating material. For example, the insulating material may include a polymer material such as epoxy, an oxide or an oxynitride. In other embodiments, the material of the blocking structure 104 may also be a conductive material. For example, the conductive material may include a metal material or a metal nitride. In an embodiment, a method of forming the blocking structure 104 may include a dispensing process or an inkjet printing process. First, an ink including the material of the blocking structure 104 is formed on the substrate 100 at one side of the patterned layer 102. Then, a curing process is performed to remove a solvent in the ink, so as to form the blocking structure 104. The blocking structure 104 is formed that a thickness h2 thereof is smaller than the thickness h1 of the patterned layer 102. In an embodiment, a range of a ratio of the thickness h2 of the blocking structure 104 to the thickness h1 of the patterned layer 102 may be between 1:2 and 3:20. A range of a ratio of an interval d1 between the blocking structure 104 and the patterned layer 102 to the thickness h1 of the patterned layer 102 may be between 3:5 and 7:4. In an embodiment, a viscosity coefficient of the ink used to form the blocking structure 104 may be larger than 1 mPa·s, that is, larger than a viscosity coefficient of water. Thereby, it is helpful to control the thickness h2 of the blocking structure 104 and the interval d1 between the blocking structure 104 and the patterned layer 102.

In other embodiments, the method of forming the blocking structure 104 may also be other suitable coating processes, and a cross-sectional shape of the blocking structure 104 is not limited to the hemispherical shape as shown in FIG. 1A. In an embodiment, the blocking structure 104 may be formed to surround the patterned layer 102, so as to form a closed pattern. In other embodiments, the blocking structure 104 may partially surround the patterned layer 102.

Figure 1B:
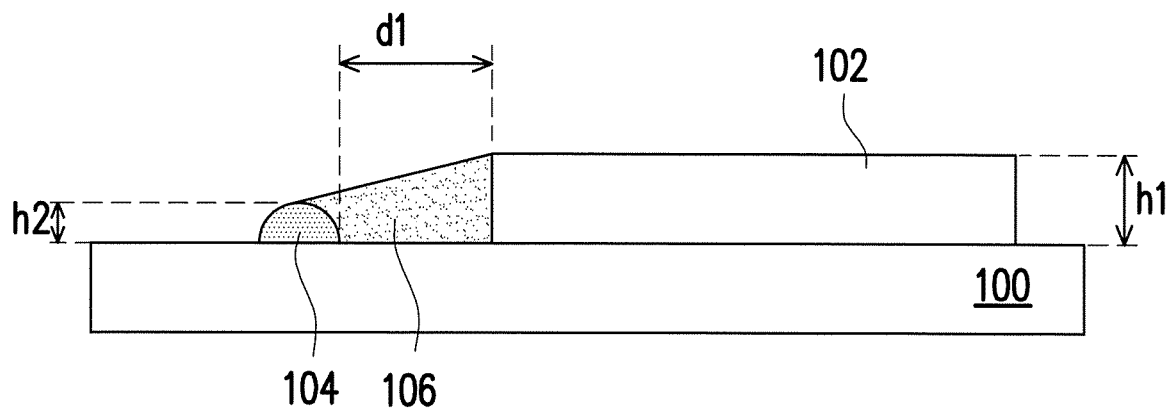

Referring to FIG. 1B, a cantilever structure 106 is then formed. The cantilever structure 106 is formed to be connected between the patterned layer 102 and the blocking structure 104. In an embodiment, a method of forming the cantilever structure 106 may include an inkjet printing process, which includes steps of forming an ink on the substrate 100 and performing a curing process. By providing the blocking structure 104, a diffusion area of the ink for forming the cantilever structure 106 can be confined between the blocking structure 104 and the patterned layer 102. Thereby, the size of the cantilever structure 106 can be easily adjusted by adjusting the thickness h2 of the blocking structure 104 and the interval d1 between the blocking structure 104 and the patterned layer 102. Additionally, since the diffusion area of the ink used to form the cantilever structure 106 can be confined, the ink with a lower viscosity coefficient can be selected. Thus, the ink can be quickly diffused between the blocking structure 104 and the patterned layer 102, and then cured to form the cantilever structure 106. Therefore, the speed of forming the cantilever structure 106 can be increased. In an embodiment, the viscosity coefficient of the ink used to form the cantilever structure 106 may be less than the viscosity coefficient of the ink used to form the blocking structure 104. For example, the viscosity coefficient of the ink used to form the cantilever structure 106 may be less than 1 mPa·s.

In an embodiment, a top surface of the cantilever structure 106 may be an inclined surface, and a higher side thereof is connected to the patterned layer 102, while a lower side thereof is connected to the blocking structure 104. Particularly, the inclined surface can be connected between a top portion of sidewalls of the patterned layer 102 and a top portion of the blocking structure 104. Therefore, a slope between one side of the patterned layer 102 and the substrate 100 can be reduced. Additionally, the aforementioned slope can be easily changed by adjusting the thickness h2 of the blocking structure 104, the thickness h1 of the patterned layer 102 and the interval d1 between the blocking structure 104 and the patterned layer 102. For example, the thickness of the blocking structure 104 can be adjusted by adjusting the viscosity coefficient of the ink used to form the blocking structure 104. More specifically, the higher the viscosity coefficient of the ink used to form the blocking structure 104, the more difficult the ink to spread out. Thus, it is easier to form the blocking structure 104 with a larger thickness.

In other embodiments, the top surface of the cantilever structure 106 may be a plane, an inclined surface, a curved surface or a combination thereof, and the cantilever structure 106 is formed that a step height between the patterned layer 102 and the top surface of the cantilever structure 106 is smaller than 200 nm. Thereby, the step height at one side of the patterned layer 102 can be reduced. Additionally, the thicknesses of the blocking structure 104 and the cantilever structure 106 can be adjusted to easily change the step height between the patterned layer 102 and the top surface of the cantilever structure 106.

In an embodiment, a material of the cantilever structure 106 may be different from a material of the blocking structure 104. For example, the material of the cantilever structure 106 may be an insulating material, and the material of the blocking structure 104 may be a conductive material. On the contrary, the material of the cantilever structure 106 may be a conductive material, and the material of the blocking structure 104 may be an insulating material. In other embodiments, the material of the cantilever structure 106 and the blocking structure 104 may be an insulating material or a conductive material at the same time.

Figure 1C:
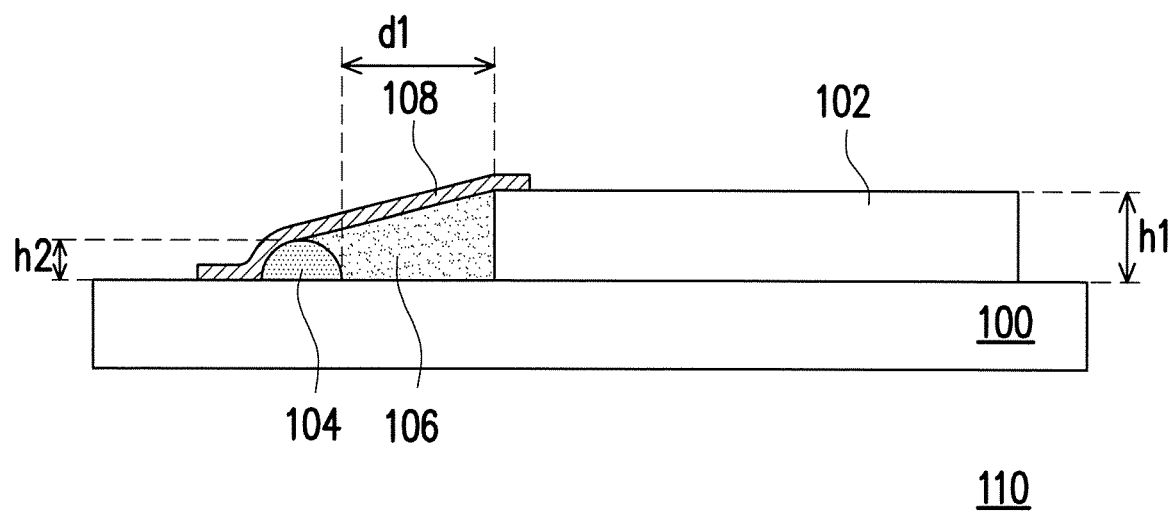

Referring to FIG. 1C, a connection structure 108 is subsequently formed to complete the fabrication of the patterned structure 110. The connection structure 108 is formed to be connected between the patterned layer 102 and the substrate 100 at one side of the patterned layer 102, and located on the cantilever structure 106 and the blocking structure 104 or covers the cantilever structure 106 and the blocking structure 104. A method of forming the connection structure 108 may include an inkjet printing process. A material of the connection structure 108 may include a conductive material or an insulating material. In the embodiment, the material of the connection structure 108 may be different from the material of the blocking structure 104. For example, the material of the connection structure 108 may be a conductive material, and the material of the blocking structure 104 may be an insulating material. Additionally, in an embodiment, the material of the connection structure 108 and the cantilever structure 106 may be an insulating material or a conductive material at the same time. Thus, the cantilever structure 106 and the connection structure 108 can be formed in the same step, and the process can be further simplified.

By providing the blocking structure 104 and the cantilever structure 106, the slope between one side of the patterned layer 102 and the substrate 100 can be reduced, or the step height between the patterned layer 102 and the top surface of the cantilever structure 106 can be smaller than 200 nm. Therefore, when forming the connection structure 108, the phenomenon of discontinuity of the connection structure 108 on the sidewalls of the patterned layer 102 can be prevented, thereby increasing the step coverage of the connection structure 108. Additionally, the slope of the top surface of the cantilever structure 106 or the step height of the patterned layer 102 and the top surface of the cantilever structure 106 can be changed by adjusting the thickness h2 of the blocking structure 104, the thickness h1 of the patterned layer 102 and the interval dl. Therefore, a length of the connection structure 108 located on the cantilever structure 106 and the blocking structure 104 can be indirectly adjusted, such that a resistance of the connection structure 108 and the overall area of the patterned structure 110 can be easily adjusted.

In the following, the patterned structure 110 of the invention will be described in accompany with FIG. 1C. The patterned structure 110 includes the patterned layer 102, the blocking structure 104, the cantilever structure 106 and the connection structure 108. The patterned layer 102 is disposed on the substrate 100. The blocking structure 104 is disposed on the substrate 100 at one side of the patterned layer 102, wherein the thickness h2 of the blocking structure 104 is smaller than the thickness h1 of the patterned layer 102. The cantilever structure 106 is connected between the patterned layer 102 and the blocking structure 104. The connection structure 108 is connected between the patterned layer 102 and the substrate 100 at one side of the patterned layer 102, and located on the cantilever structure 106 and the blocking structure 104 or covers the cantilever structure 106 and the blocking structure 104. The thickness h1 of the patterned layer 102 may be larger than 200 nm. The range of the ratio of the thickness h2 of the blocking structure 104 to the thickness h1 of the patterned layer 102 may be between 1:2 and 3:20. The range of the ratio of the interval dl between the blocking structure 104 and the patterned layer 102 to the thickness h1 of the patterned layer 102 may be between 3:5 and 7:4. The blocking structure 104 may surround the patterned layer 102. The top surface of the cantilever structure 106 may be an inclined surface, and the higher side thereof is connected to the patterned layer 102, while the lower side thereof is connected to the blocking structure 104. The material of the blocking structure 104, the material of the cantilever structure 106, and the material of the connection structure 108 may respectively include a conductive material or an insulating material. In the embodiment, the material of the blocking structure 104 may be different from the material of the connection structure 108.

For example, the material of the blocking structure 104 may be an insulating material, and the material of the connection structure 108 may be a conductive material. Additionally, the material of the cantilever structure 106 may be different from the material of the blocking structure 104. For example, the material of the cantilever structure 106 and the material of the blocking structure 104 may be an insulating material different from each other.

Figure 2:
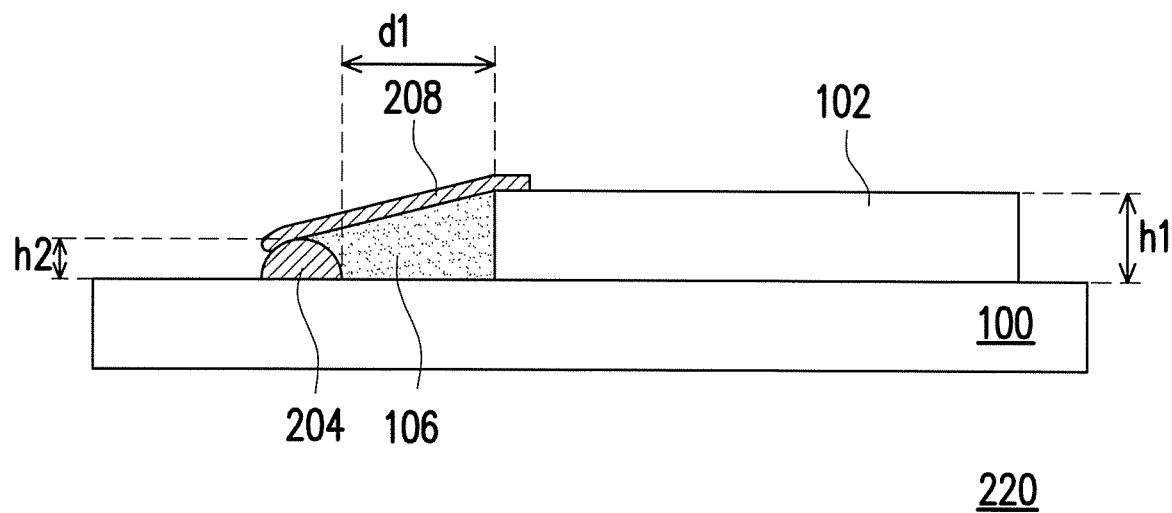
FIG. 2 is a schematic cross-sectional view of a patterned structure according to an embodiment of the invention.

FIG. 2 is a schematic cross-sectional view of a patterned structure according to an embodiment of the invention. A patterned structure 220 of FIG. 2 is similar to the patterned structure 110 of FIG. 1C. The difference will be described below in detail, and the same would not be repeated.

Referring to FIG. 2, a connection structure 208 of the patterned structure 220 is disposed on the patterned layer 102, the cantilever structure 106, and the blocking structure 204. A material of the blocking structure 204 and a material of the connection structure 208 both include a conductive material. In an embodiment, the connection structure 208 may be an interconnection of an electronic device. Since the connection structure 208 can be electrically connected to the substrate 100 through the blocking structure 204, the connection structure 208 does not need to cross the blocking structure 204 to be in contact with the substrate 100. Therefore, the mechanical strength of the connection structure 208 can be enhanced, thereby improving the reliability of the electronic device.

Figure 3:
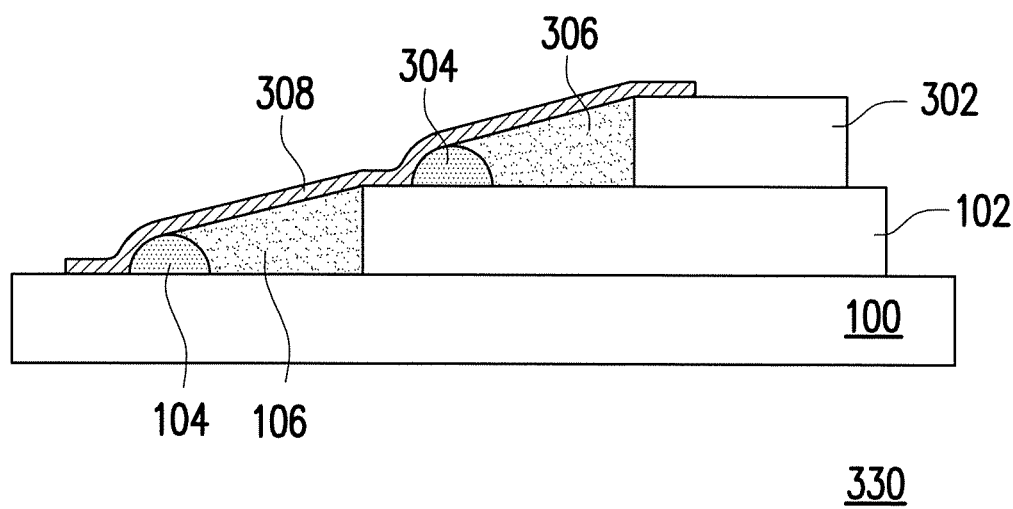
FIG. 3 is a schematic cross-sectional view of a patterned structure according to an embodiment of the invention.

FIG. 3 is a schematic cross-sectional view of a patterned structure according to an embodiment of the invention. A patterned structure 330 of FIG. 3 is similar to the patterned structure 110 of FIG. 1C. The difference will be described below in detail, and the same would not be repeated.

Referring to FIG. 3, the patterned structure 330 may be a bilayer structure. Specifically, the patterned structure 330 further includes a patterned layer 302, a blocking structure 304, and a cantilever structure 306 disposed on the patterned layer 102. Additionally, the connection structure 308 may be formed to be connected to the patterned layer 302, the patterned layer 102, and the substrate 100. The connection structure 308 is located on the cantilever structure 306, the blocking structure 304, the cantilever structure 106 and the blocking structure 104, or may cover the cantilever structure 306, the blocking structure 304, the cantilever structure 106 and the blocking structure 104. In an embodiment, the connection structure 308 may cover the cantilever structure 306, the blocking structure 304, the patterned layer 102 and the substrate 100. Additionally, in other embodiments, the patterned structure may be a three-layer structure, a four-layer structure and so on. The invention is not limited to the number of layers of the patterned structure.

In summary, by providing the blocking structure and the cantilever structure at one side of the patterned layer, the slope between the patterned layer and the substrate at one side of the patterned layer can be reduced, or the step height at one side of the patterned layer can be reduced. Therefore, while forming the connection structure on the patterned layer, the phenomenon of discontinuity of the connection structure on the sidewalls of the patterned layer can be prevented, thereby increasing the step coverage of the connection structure. Additionally, the size of the cantilever structure can be easily adjusted by adjusting the thickness of the blocking structure, the thickness of the cantilever structure and the interval between the blocking structure and the patterned layer. In other words, the aforementioned slope or the step height can be easily adjusted.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A patterned structure for an electronic device, comprising:
    a patterned layer, disposed on a substrate;
    a blocking structure, disposed on the substrate at one side of the patterned layer, wherein the blocking structure has a curved top surface, a material of the blocking structure is an insulating material, a thickness of the blocking structure is smaller than a thickness of the patterned layer, and a viscosity coefficient of an ink used to form the blocking structure is larger than 1 mPa·s;
    a cantilever structure, disposed on the substrate and located between the patterned layer and the blocking structure, wherein the cantilever structure is connected with the patterned layer and the blocking structure, a viscosity coefficient of an ink used to form the cantilever structure is less than the viscosity coefficient of the ink used to form the blocking structure, and wherein the topmost end of the cantilever structure is substantially leveled with or lower than a top surface of the patterned layer; and
    a connection structure, connected between the patterned layer and the substrate at one side of the patterned layer, and located on the cantilever structure and the blocking structure, and the connection structure is in direct physical contact with a portion of the curved top surface of the blocking structure, wherein the thickness of the blocking structure is larger than a thickness of the connection structure.

2. The patterned structure according to claim 1, wherein the thickness of the patterned layer is more than 200 nm.

3. The patterned structure according to claim 1, wherein a range of a ratio of the thickness of the blocking structure to the thickness of the patterned layer is between 1:2 and 3:20.

4. The patterned structure according to claim 1, wherein a range of a ratio of an interval between the blocking structure and the patterned layer to the thickness of the patterned layer is between 3:5 and 7:4.

5. The patterned structure according to claim 1, wherein the blocking structure surrounds the patterned layer.

6. The patterned structure according to claim 1, wherein a top surface of the cantilever structure is an inclined surface, and a higher side thereof is connected to the patterned layer, while a lower side thereof is connected to the blocking structure.

7. The patterned structure according to claim 1, wherein a material of the cantilever structure is different from a material of the blocking structure.

8. The patterned structure according to claim 1, wherein a material of the connection structure comprises a conductive material or an insulating material.

9. A patterned structure for an electronic device, comprising:
    a patterned layer, disposed on a substrate;
    a blocking structure, disposed on the substrate at one side of the patterned layer, wherein the blocking structure has a curved top surface, a material of the blocking structure is an insulating material, a thickness of the blocking structure is smaller than a thickness of the patterned layer, and a viscosity coefficient of an ink used to form the blocking structure is larger than 1 mPa·s;
    a cantilever structure, disposed on the substrate and located between the patterned layer and the blocking structure, wherein the cantilever structure is connected with the patterned layer and the blocking structure, a viscosity coefficient of an ink used to form the cantilever structure is less than the viscosity coefficient of the ink used to form the blocking structure, and wherein the topmost end of the cantilever structure is substantially leveled with or lower than a top surface of the patterned layer; and
    a connection structure, disposed on the patterned layer, the cantilever structure and the blocking structure, and the connection structure is in direct physical contact with a portion of the curved top surface of the blocking structure, wherein a material of the connection structure comprises a conductive material, and the thickness of the blocking structure is larger than a thickness of the connection structure.

10. A manufacturing method of a patterned structure for an electronic device, comprising:
    forming a patterned layer on a substrate;
    using an ink to form a blocking structure having a curved top surface, wherein a material of the blocking structure is an insulating material, a viscosity coefficient of the ink used to form the blocking structure is larger than 1 m·Pas, the blocking structure is formed on the substrate and at one side of the patterned layer, a thickness of the blocking structure is smaller than a thickness of the patterned layer;
    using another ink to form a cantilever structure, wherein a viscosity coefficient of the ink used to form the cantilever structure is less than the viscosity coefficient of the ink used to form the blocking structure, the cantilever structure is formed on the substrate and located between the patterned layer and the blocking structure, the cantilever structure is connected with the patterned layer and the blocking structure, and wherein the topmost end of the cantilever structure is substantially leveled with or lower than a top surface of the patterned layer; and
    forming a connection structure in direct physical contact with a portion of the curved top surface of the blocking structure, wherein the connection structure is formed to be connected between the patterned layer and the substrate at one side of the patterned layer, and is formed on the cantilever structure and the blocking structure, wherein the thickness of the blocking structure is larger than a thickness of the connection structure.

11. The manufacturing method of the patterned structure according to claim 10, wherein a method of forming the blocking structure, the cantilever structure and the connection structure comprises an inkjet printing.

* * * * *